(12) United States Patent
Hsieh et al.

(10) Patent No.: US 11,269,257 B2
(45) Date of Patent: Mar. 8, 2022

(54) APPARATUS AND METHOD FOR GENERATING EXTREME ULTRAVIOLET RADIATION

(71) Applicant: TAIWAN SEMICONDUCTOR MANUFACTURING CO., LTD., Hsinchu (TW)

(72) Inventors: Chieh Hsieh, Taoyuan (TW); Kuan-Hung Chen, Taoyuan (TW); Chun-Chia Hsu, Kaohsiung (TW); Shang-Chieh Chien, New Taipei (TW); Bo-Tsun Liu, Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/068,197

(22) Filed: Oct. 12, 2020

(65) Prior Publication Data

US 2021/0041787 A1 Feb. 11, 2021

Related U.S. Application Data

(62) Division of application No. 16/535,003, filed on Aug. 7, 2019, now Pat. No. 10,802,406.

(60) Provisional application No. 62/745,267, filed on Oct. 12, 2018, provisional application No. 62/719,428, filed on Aug. 17, 2018.

(51) Int. Cl.
*G03F 7/20* (2006.01)
*G06F 30/39* (2020.01)

(52) U.S. Cl.
CPC ........ *G03F 7/70033* (2013.01); *G03F 7/2004* (2013.01); *G06F 30/39* (2020.01)

(58) Field of Classification Search
CPC ..... G03F 7/70033; G03F 7/2004; G06F 30/39
USPC ...................................... 355/67–71; 250/504
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,678,431 B2* | 6/2017 | Lu | G03F 7/70558 |
| 9,869,928 B2 | 1/2018 | Huang et al. | |

(Continued)

OTHER PUBLICATIONS

Notice of Allowance issued in U.S. Appl. No. 16/535,003, dated Jun. 15, 2020.

*Primary Examiner* — Hung Nguyen
(74) *Attorney, Agent, or Firm* — McDermott Will & Emery LLP

(57) ABSTRACT

An apparatus for generating extreme ultraviolet (EUV) radiation includes a droplet generator configured to generate target droplets. An excitation laser is configured to heat the target droplets using excitation pulses to convert the target droplets to plasma. An energy detector is configured to measure a variation in EUV energy generated when the target droplets are converted to plasma. A feedback controller is configured to adjust parameters of the droplet generator and/or the excitation laser based on the variation in EUV energy.

20 Claims, 19 Drawing Sheets

(56) References Cited

U.S. PATENT DOCUMENTS

| | | |
|---|---|---|
| 9,869,934 B2 | 1/2018 | Huang et al. |
| 9,869,939 B2 | 1/2018 | Yu et al. |
| 2018/0330249 A1 | 11/2018 | Hajiyev et al. |
| 2020/0103746 A1 | 4/2020 | Huang et al. |

* cited by examiner

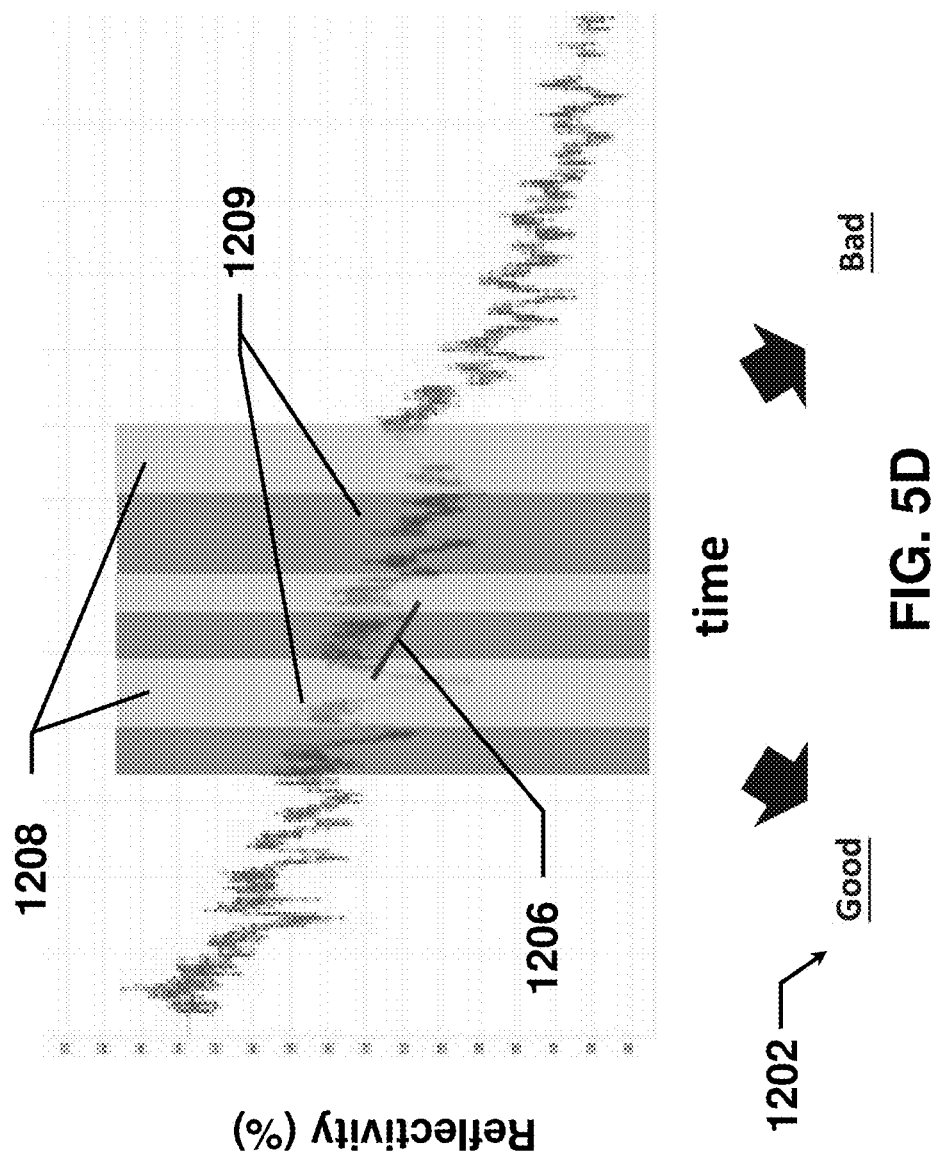

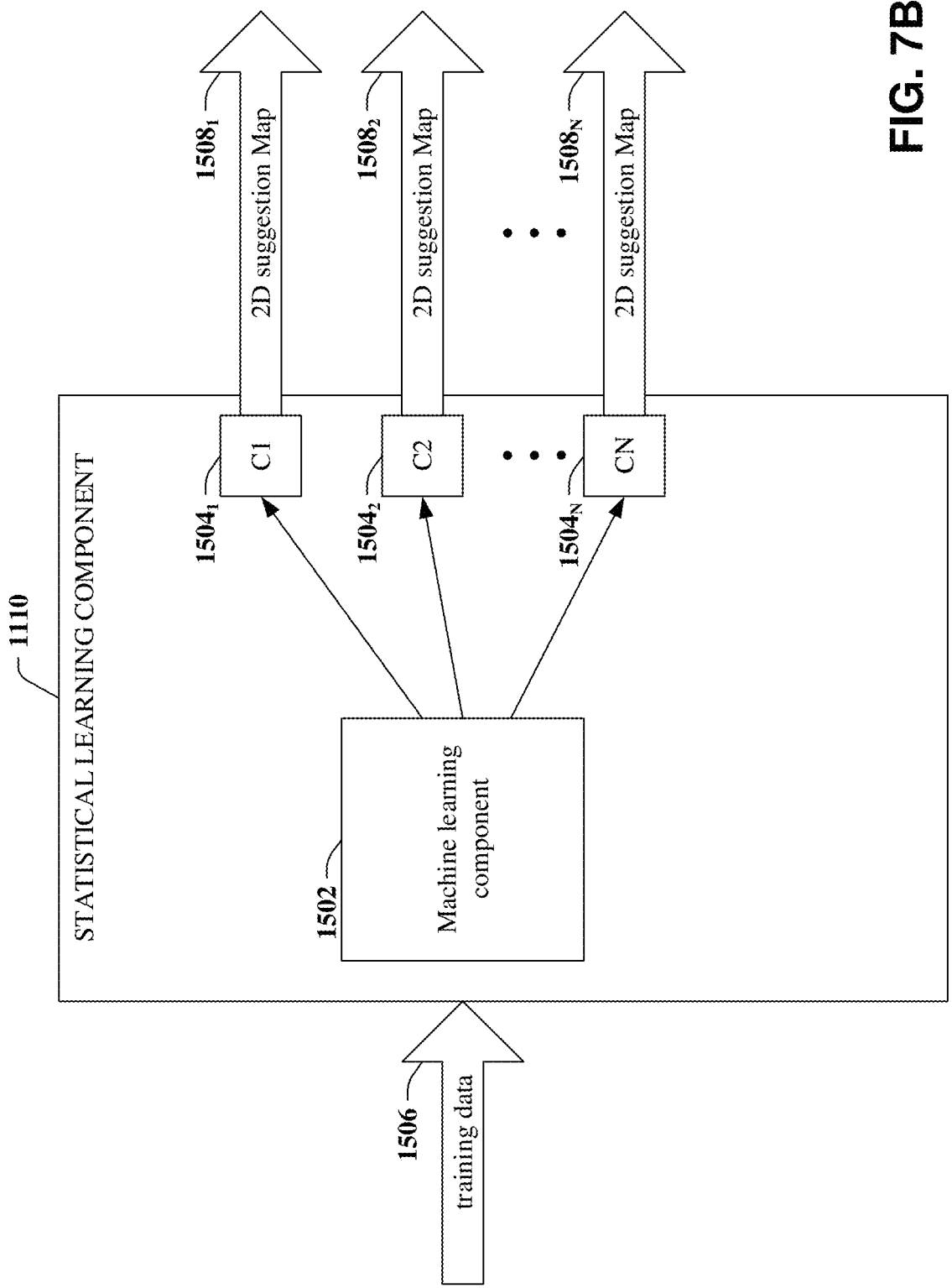

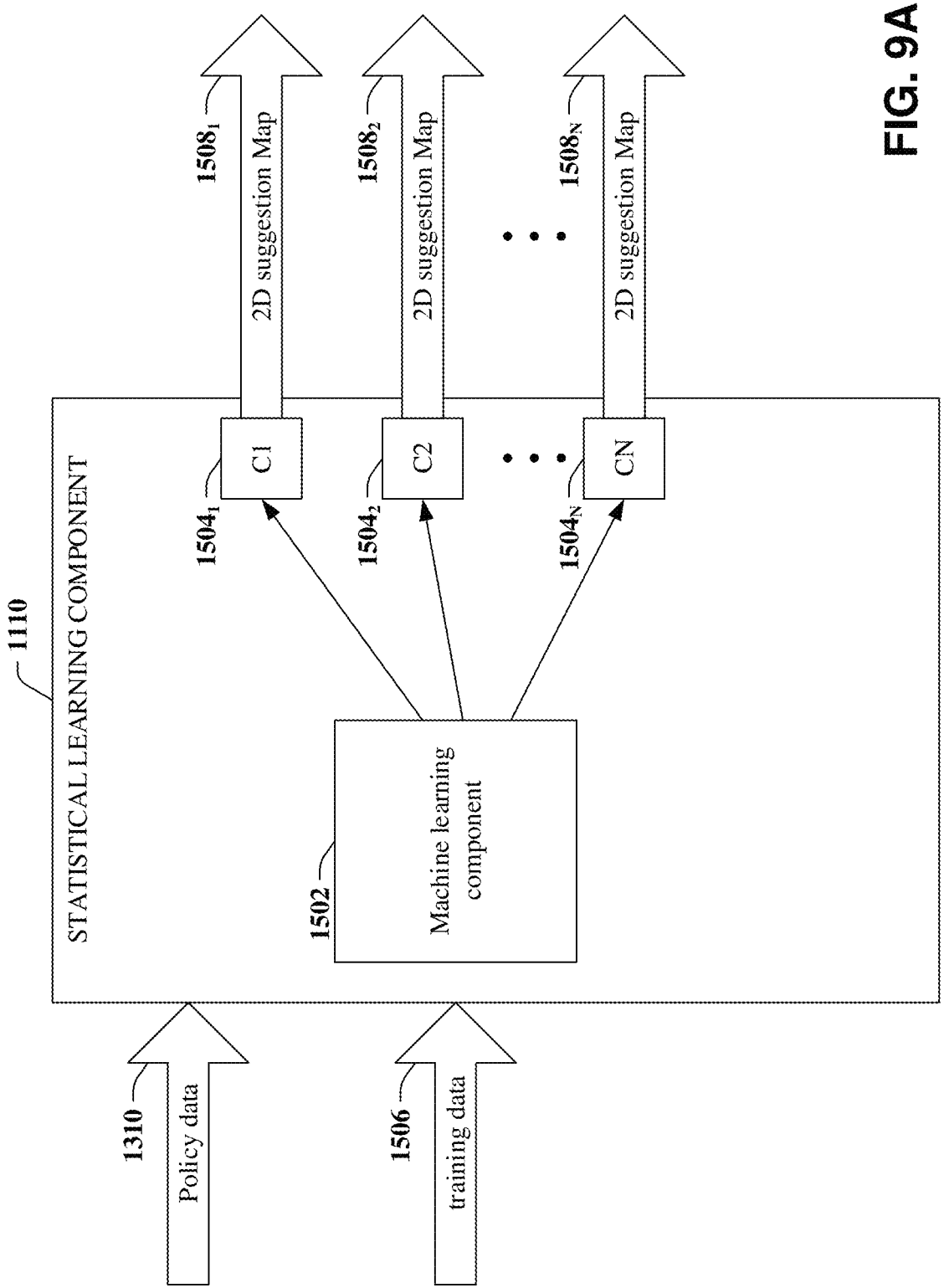

APPARATUS AND METHOD FOR GENERATING EXTREME ULTRAVIOLET RADIATION

CROSS REFERENCE TO RELATED APPLICATION

This application is a Divisional Application of U.S. patent application Ser. No. 16/535,003, filed on Aug. 7, 2019, now U.S. Pat. No. 10,802,406, which claims the priority of U.S. Provisional Application No. 62/719,428 filed on Aug. 17, 2018, and U.S. Provisional Application No. 62/745,267 filed on Oct. 12, 2018, the entire disclosure of each of incorporated herein by reference.

BACKGROUND

The demand for computational power has increased exponentially. This increase in computational power is met by increasing the functional density, i.e., number of interconnected devices per chip, of semiconductor integrated circuits (ICs). With the increase in functional density, the size of individual devices on the chip has decreased. The decrease in size of components in ICs has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP based EUV source a high-power laser beam is focused on small tin droplet targets to form highly ionized plasma that emits EUV radiation with a peak maximum emission at 13.5 nm. The intensity of the EUV radiation produced by LPP depends on the effectiveness with which the high-powered laser can produce the plasma from the droplet targets. Synchronizing the pulses of the high-powered laser with generation and movement of the droplet targets can improve the efficiency of an LPP based EUV radiation source.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A, 5B, 5C, 5D and 5E show schematic diagrams of generating a classified targeting probability map according to an embodiment of the disclosure.

FIG. 7B shows a schematic of the apparatus for generating 2D suggestion map in according to some embodiments of the present disclosure.

FIG. 9A shows a schematic of the apparatus for generating 2D suggestion map with policy data in according to some embodiments of the present disclosure.

DETAILED DESCRIPTION

Figure 1:
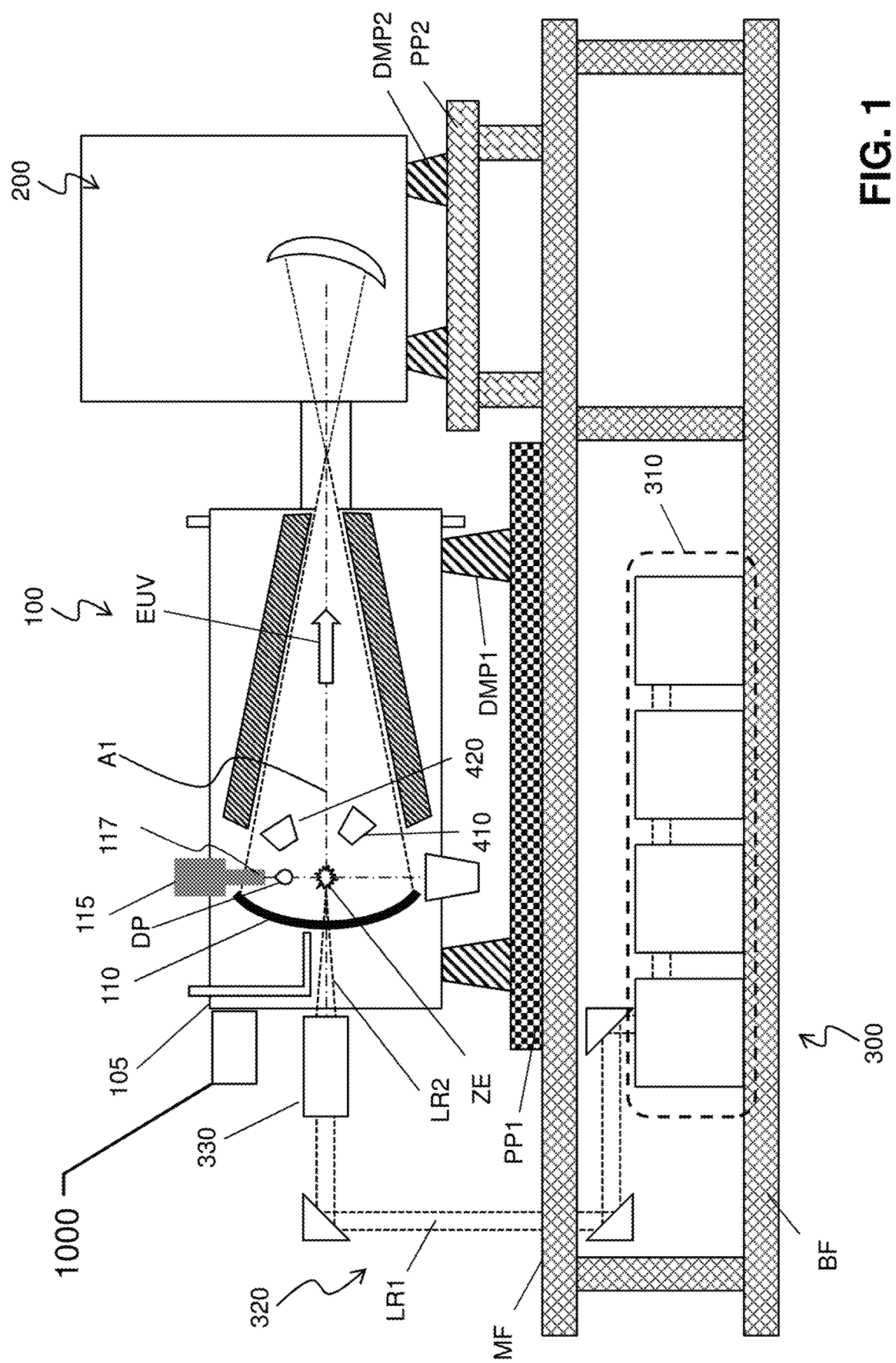
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatuses and methods for controlling an excitation laser used in a laser produced plasma (LPP) based EUV radiation source. The excitation laser heats metal (e.g., tin) target droplets in the LPP chamber to ionize the droplets to a plasma which emits EUV radiation. For optimum heating of the target droplets, the target droplets have to arrive at the focal point of the excitation laser at the same time as an excitation pulse from the excitation laser. Thus, synchronization between the target droplets and trigger time for triggering an excitation pulse from the excitation laser contributes to efficiency and stability of the LPP EUV radiation source. One of the objectives of the present disclosure is directed to controlling the excitation laser to provide optimum heating of target droplets.

FIG. 1 is a schematic view of an EUV lithography system with a laser production plasma (LPP) based EUV radiation source, constructed in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor. Each of the EUV radiation source 100 and the exposure tool 200 are placed over pedestal plates PP1 and PP2 via dampers DMP1 and DMP2, respectively. The EUV radiation source 100 and the exposure tool 200 are coupled to each other by a coupling mechanism, which may include a focusing unit.

The lithography system is an extreme ultraviolet (EUV) lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. In an embodiment, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns ($\mu m$) to about 100 $\mu m$. For example, in an embodiment, the target droplets DP are tin droplets, each having a diameter of about 10 $\mu m$, about 25 $\mu m$, about 50 $\mu m$, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 $\mu m$ or 10.6 $\mu m$, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as "pre-pulse") is used to heat (or pre-heat) a given target droplet to create a low-density target plume with multiple smaller droplets, which is subsequently heated (or reheated) by a pulse from the main laser, generating increased emission of EUV.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplet DP in an embodiment.

The laser light LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure tool 200.

The position of the zone of excitation ZE and parameters such as laser power, main pulse to pre-pulse delay, position of the pre-pulse focus, etc. Are determined at the time the radiation source 100 is set up. The actual position of the zone of excitation ZE and parameters such as power and timing are then adjusted during wafer exposure using a feedback mechanism in various embodiments. However, these parameters change over time because of factors such as, for example, laser drift, instability in the droplet generator, and changes in chamber environment.

Figure 2A:
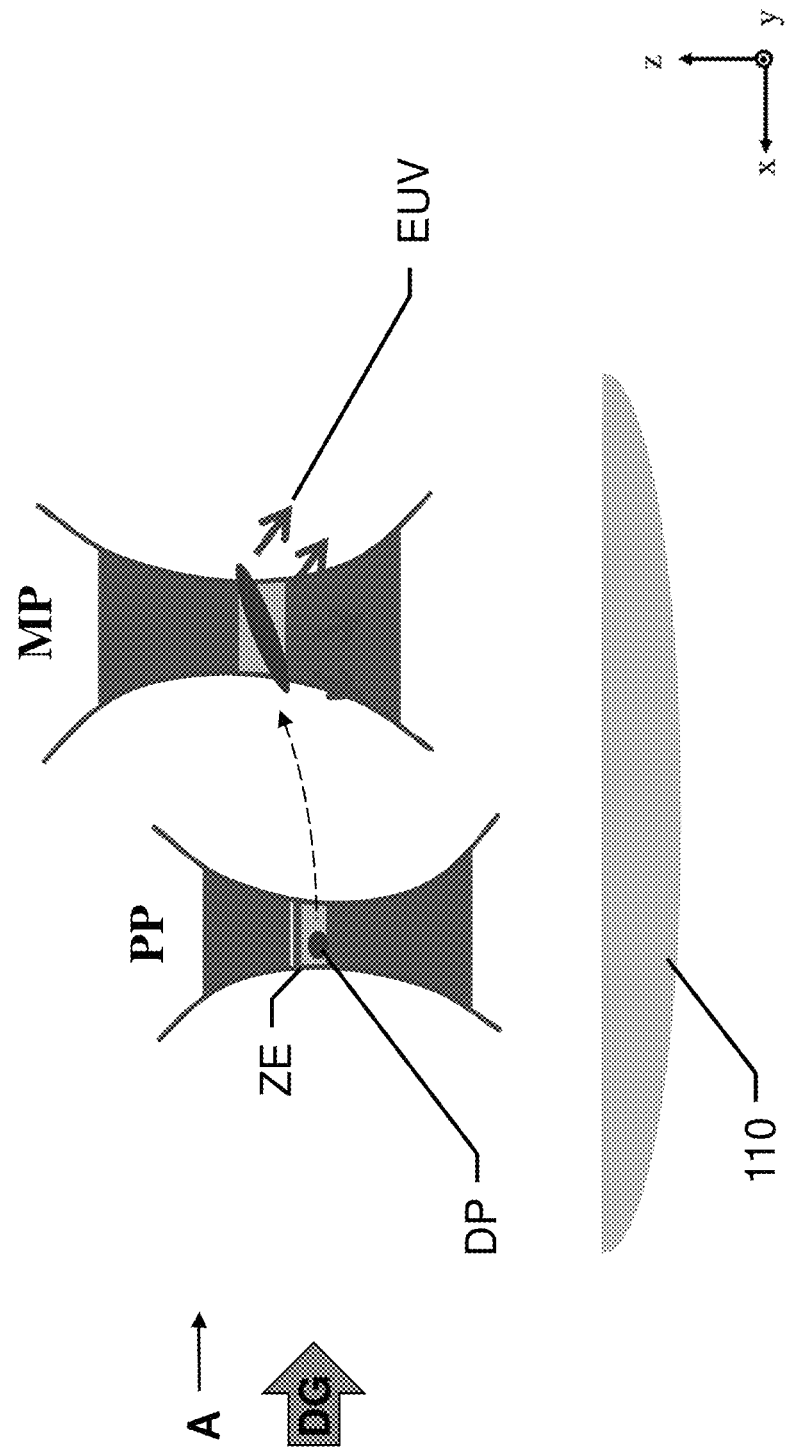
FIG. 2A schematically illustrates the movement of target droplet relative to the collector after being irradiated by the pre-pulse in X-Z plane.

FIG. 2A schematically illustrates the movement of target droplet DP relative to the collector 110 after being irradiated by the pre-pulse PP. A target droplet DP is sequentially irradiated by the pre-pulse PP and the main pulse MP. When the target droplet DP travels along X-axis in a direction "A" from the droplet generator DG to the zone of excitation ZE, the pre-pulse PP exposing the target droplet DP causes the target droplet DP to change its shape into, for example, a pancake and introduce a Z-axis component to its direction of travel in the X-Z plane.

The laser-produced plasma (LPP) generated by irradiating the target droplet DP with the laser beams PP, MP presents certain timing and control problems. The laser beams PP, MP must be timed so as to intersect the target droplet DP when it passes through the targeted point. The laser beams PP, MP must be focused on each of their focus positions, respectively, where the target droplet DP will pass. The position of the zone of excitation ZE and parameters such as, for example, laser power, time delay between the main pulse and the pre-pulse, focal point of the pre-pulse and/or main pulse, may be determined when an EUV radiation source 100 is set up. The actual position of the zone of excitation ZE and the afore-mentioned parameters are then adjusted during wafer exposure using a feedback mechanism in various embodiments. However, these parameters can change over time due to various factors such as, for example, mechanical and/or electrical drift in the radiation source, instability of the droplet generator, and changes in chamber environment.

Figure 2B:
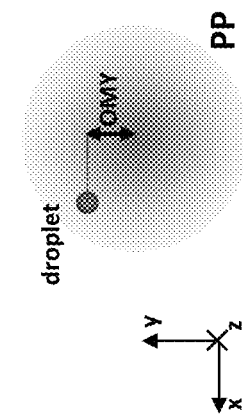
FIGS. 2B, 2C, 2D, and 2E schematically illustrate the movement of target droplet by the pre-pulse in X-Y plane.
Figure 2C:
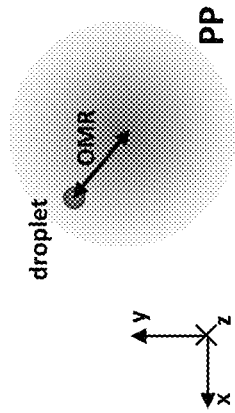
Figure 2D:
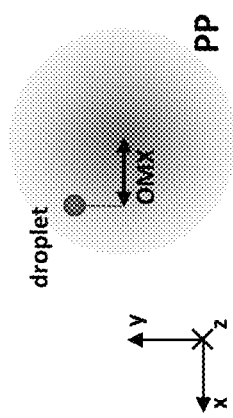
Figure 2E:
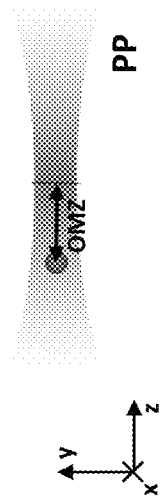

FIG. 2B illustrates an exemplary optical metrology for misalignment in the x-axis OMX. OMX is defined by a distance in the x-axis between a droplet and the focal point of the pre-pulse PP. Similarly, FIG. 2C illustrates an exemplary optical metrology for misalignment in the y-axis OMY. OMY is defined by a distance in the y-axis between the droplet and the focal point of the pre-pulse PP. FIG. 2D further illustrates an exemplary optical metrology for misalignment in the z-axis OMZ. Similar to OMX and OMY, OMZ is defined by a distance in the z-axis between a droplet and the focal point of the pre-pulse PP. FIG. 2E illustrates an exemplary optical metrology for misalignment in radius OMR. The x-axis is in the direction of motion by the droplet from the droplet generator 115. The z-axis is along the optical axis A1 of the collector mirror 110. The y-axis is perpendicular to the x-axis and the z-axis.

Figure 3A:
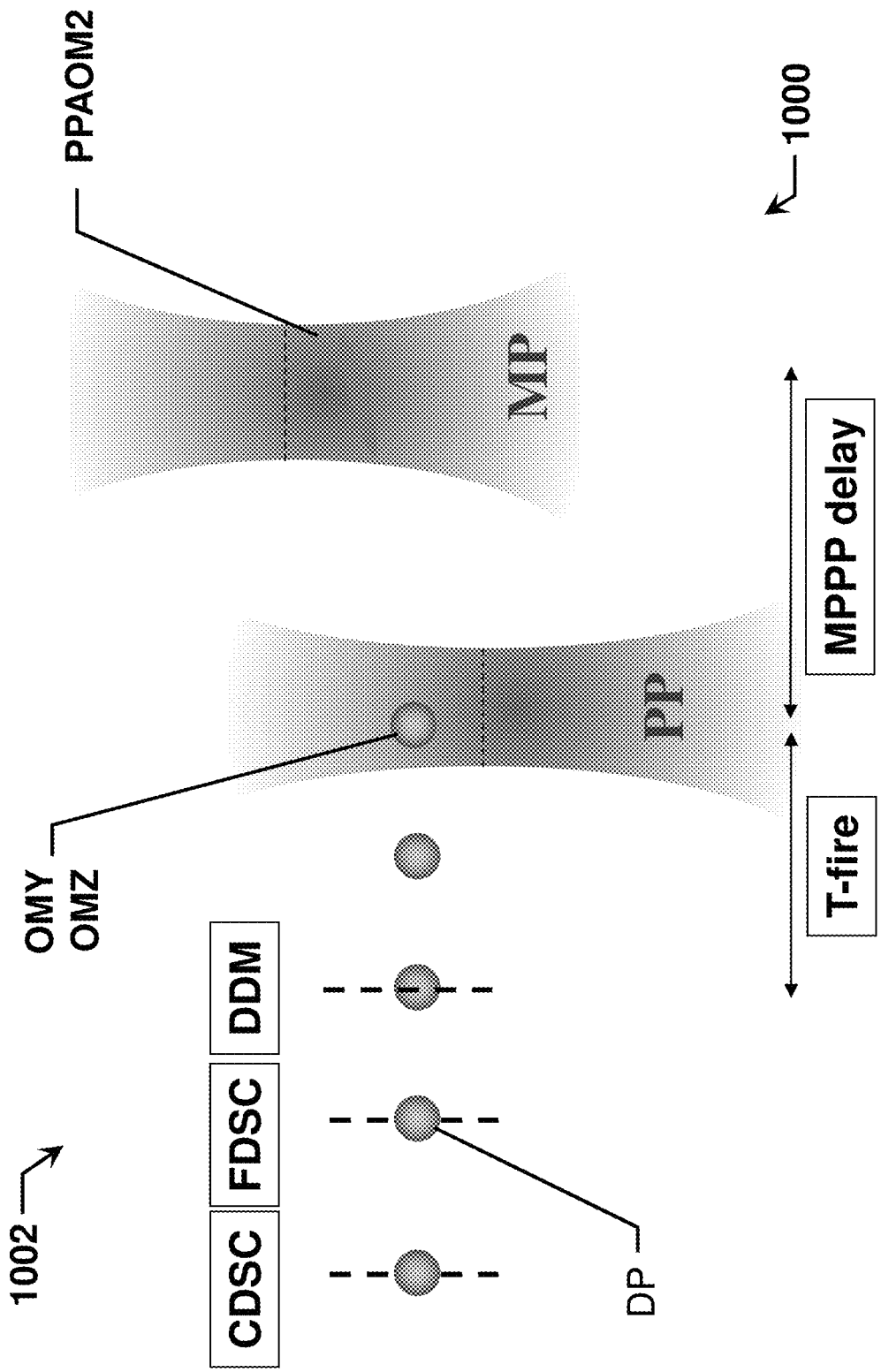
FIG. 3A schematically illustrates the various parameters to be optimized in accordance with some embodiments of the present disclosure.

In some embodiments, as shown in FIG. 3A, a coarse droplet steering camera (CDSC), a fine droplet steering camera (FDSC), and a droplet detection module (DDM) are provided to monitor the position of the droplet and adjust the triggering parameters of the pre-pulse PP and main pulse MP. In some embodiments, the DDM uses one or more low power lasers to track the velocity of the droplet DP. T-fire and MPPP delay are two exemplary timing parameters for the laser beams PP, MP. In some embodiments, tuning parameters 1002 include tuning related parameters such as for example OMY, OMZ, T-fire, and PPAOM2. T-fire is defined as a time between when the droplet DP is detected by the DDM and when the pre-pulse PP is fired. Similarly, MPPP delay is defined by a time between when main pulse MP is fired and when the pre-pulse PP is fired. As also shown in FIGS. 2C and 2D, OMY and OMZ are also defined by distances in the y-axis and the z-axis, respectively, between the droplet and the focal point of the pre-pulse PP. PPAOM2 is defined by a percentage of the pre-pulse energy to pass through a second acousto-optic modulator (AOM2).

Figure 3B:
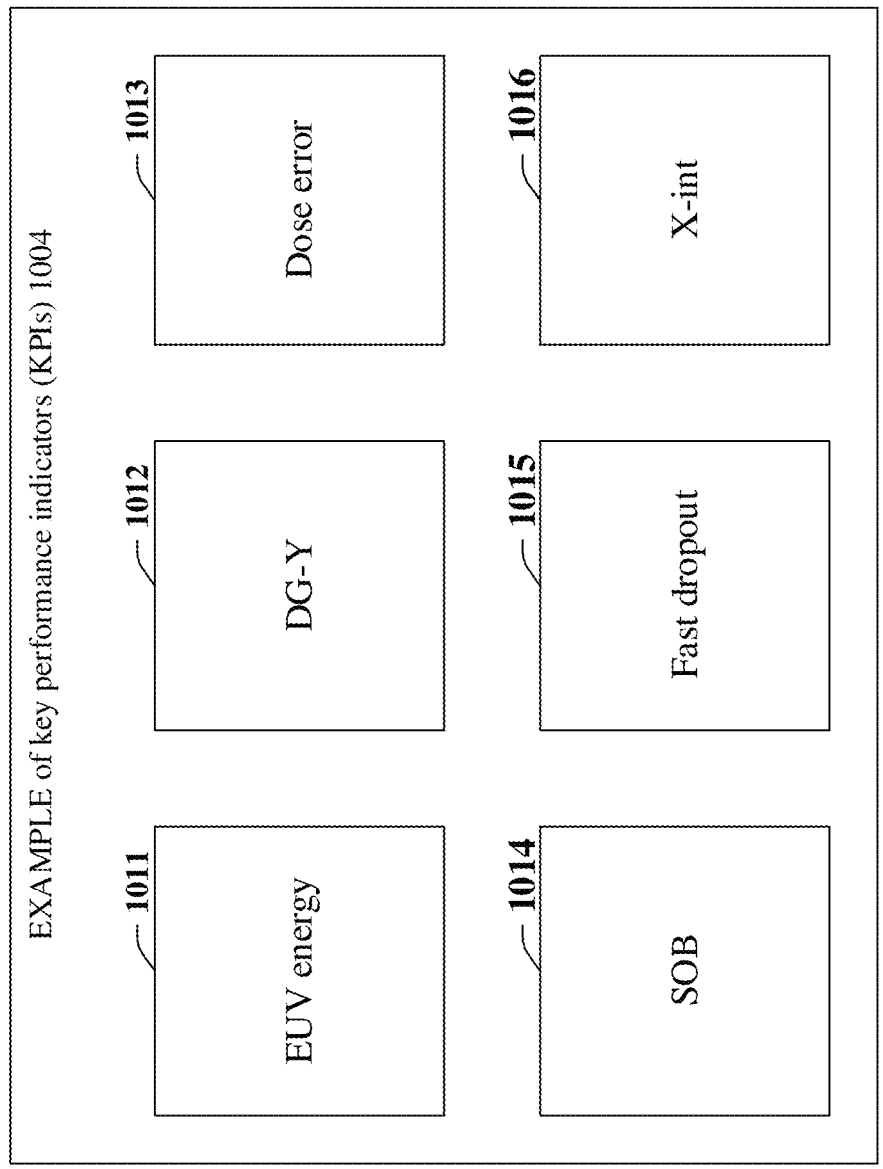
FIG. 3B illustrates the various key performance indicators (KPIs) to be re-optimized.

In some embodiments as shown in FIG. 3B, the key performance indicators 1004 includes performance related parameters, such as, for example EUV energy 1011, DG-Y 1012, Dose error 1013, SOB 1014, Fast dropout 1015, and X-int 1016. EUV energy 1011 is defined by an energy intensity emitted by the EUV source. DG-Y 1012 is defined by an offset distance in the y-axis of the droplet position. Dose error 1013 is defined as the percent difference between applied and the expected dose. The Start of Burst effect 1014 is an unstable EUV energy generated at the beginning of target droplet bursting. Fast dropout 1015 is an unstable EUV energy causing the droplet to undergo insufficient expansion before it is hit by the main pulse.

Figure 4:
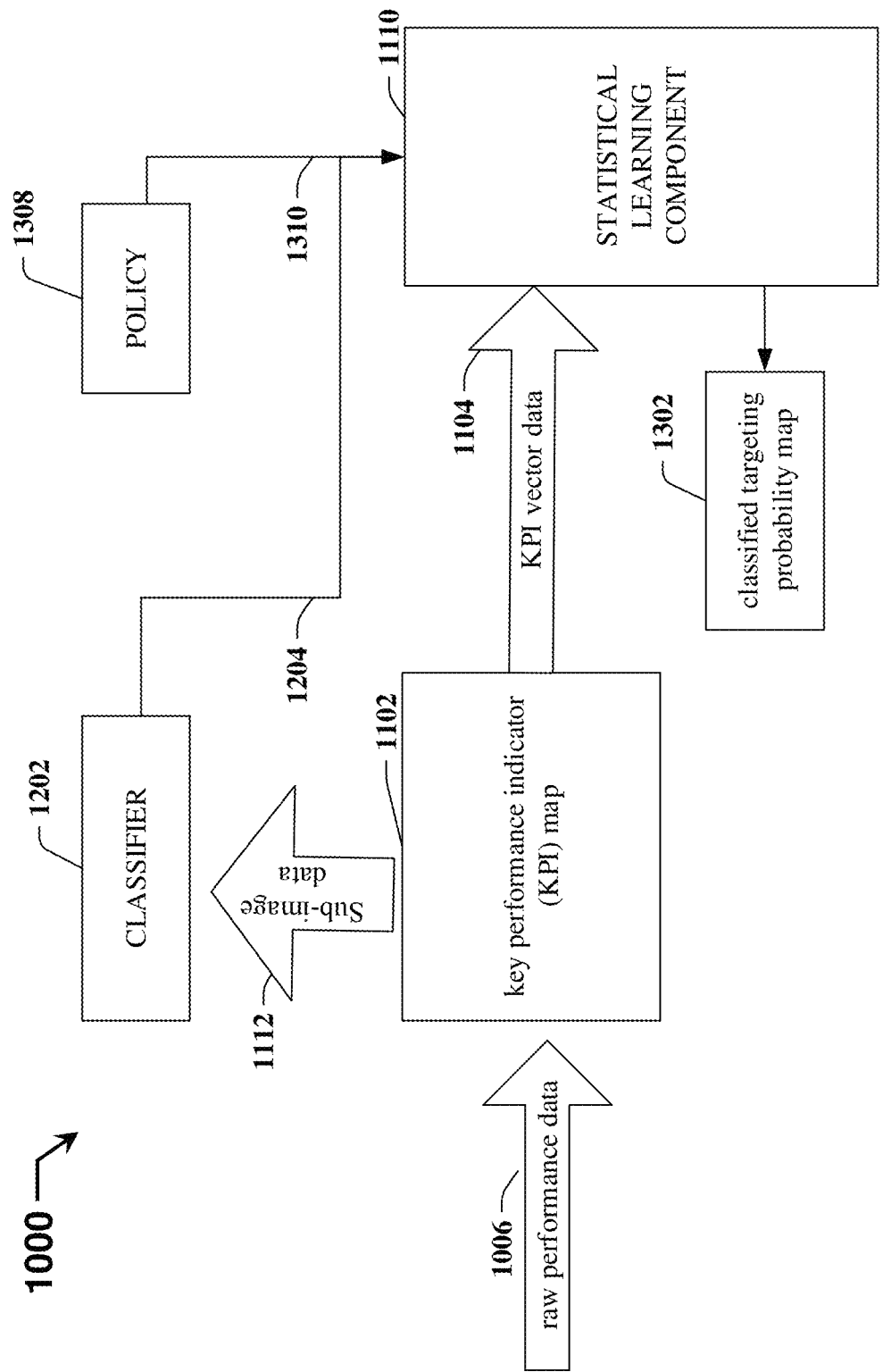
FIG. 4 shows a schematic of the apparatus for generating a classified targeting probability map in according to some embodiments of the present disclosure.

FIG. 4 illustrates a block diagram of non-limiting examples of the optimization system 1000 in accordance with one or more embodiments described herein.

Figure 5A:
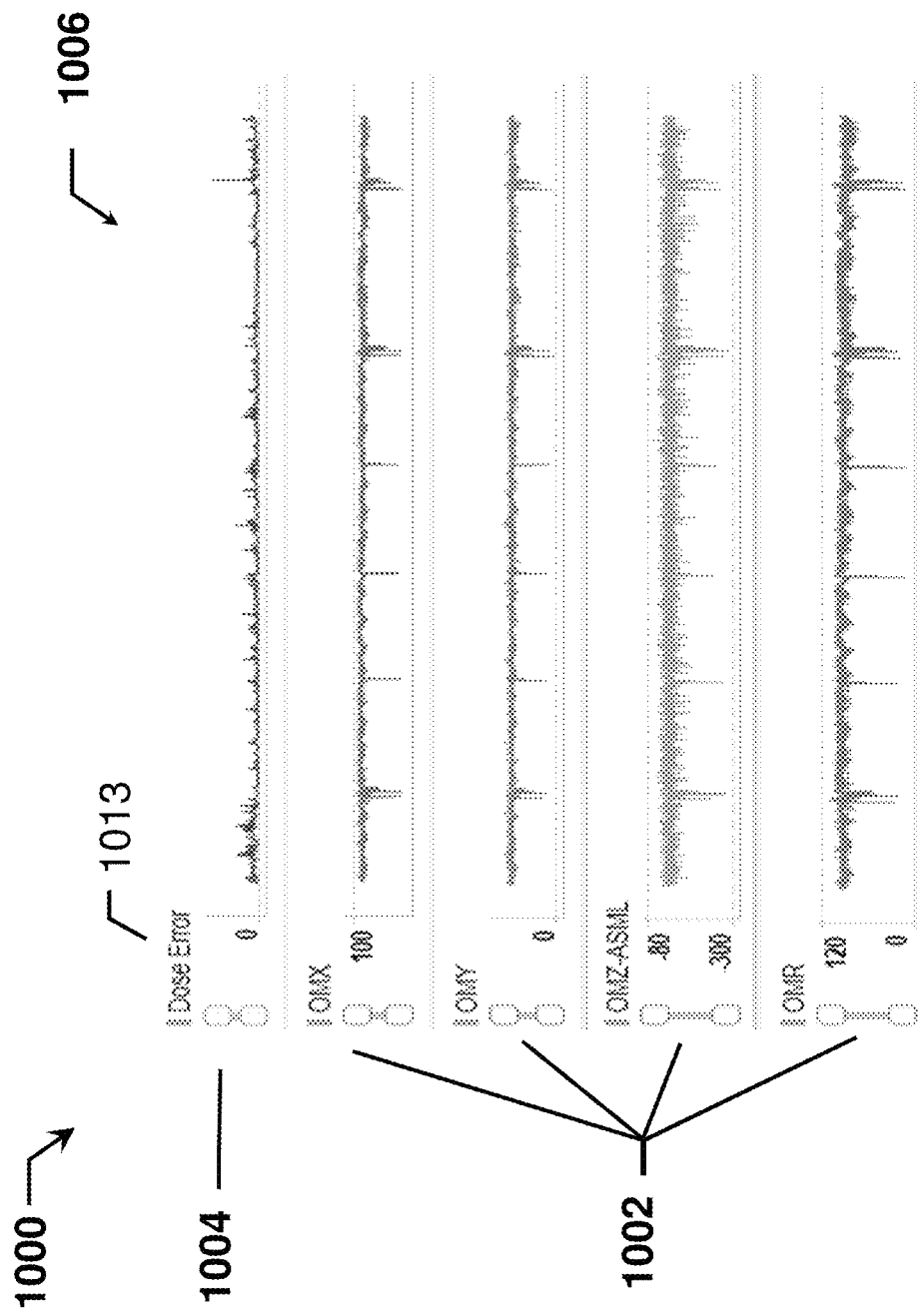

In some embodiments, as shown in FIGS. 4 and 5A, the optimization system 1000 receives raw performance data 1006. The raw performance data 1006 includes key performance indicators (KPIs) 1004, such as Dose Error 1013, and tuning parameters 1002, such as OMX, OMY, OMZ and OMR, as also described in FIGS. 3A-3B.

Figure 5B:
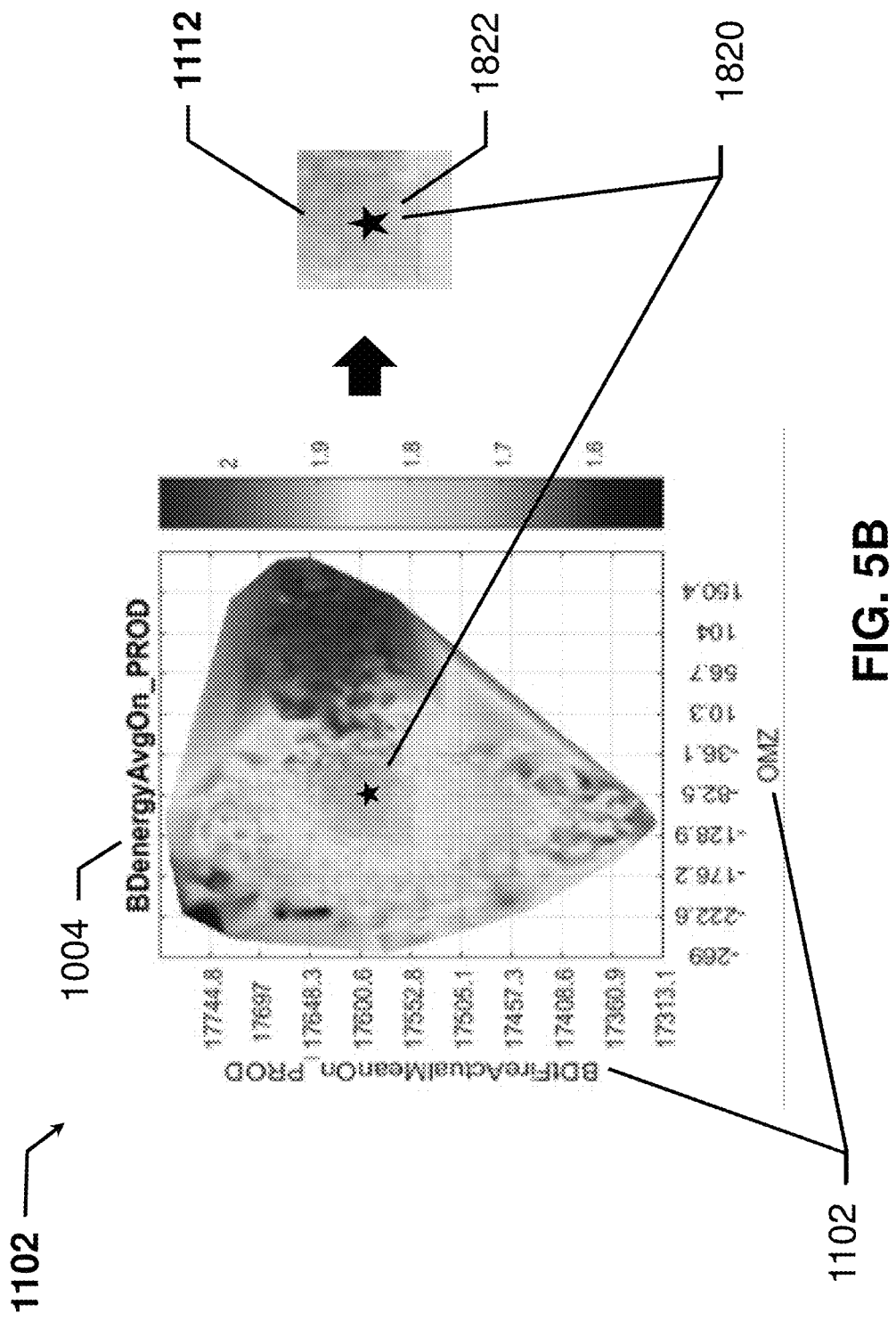

Referring to FIGS. 4 and 5B, the raw performance data 1006 can be employed by a key performance indicator map 1102 to derive key performance indicator vector data 1104. The key performance indicator map 1102 illustrates key performance indicators 1004 of interest with respect to a set of attributes among the tuning parameters 1002 derived from the raw performance data 1006. For example, in one embodiment as shown in FIG. 5B, an EUV Energy chosen as the key performance indicator is mapped to the set of attributes, OMZ in z-axis and T-fire in y-axis. A region of interest, sub-image data 1112, can be extracted from the key performance indicator map 1102. The sub-image data 1112 includes a first subset 1820 of the raw performance data 1006 that represents an original set point 1822 for the EUV Energy chosen as the key performance indicator.

Figure 5C:
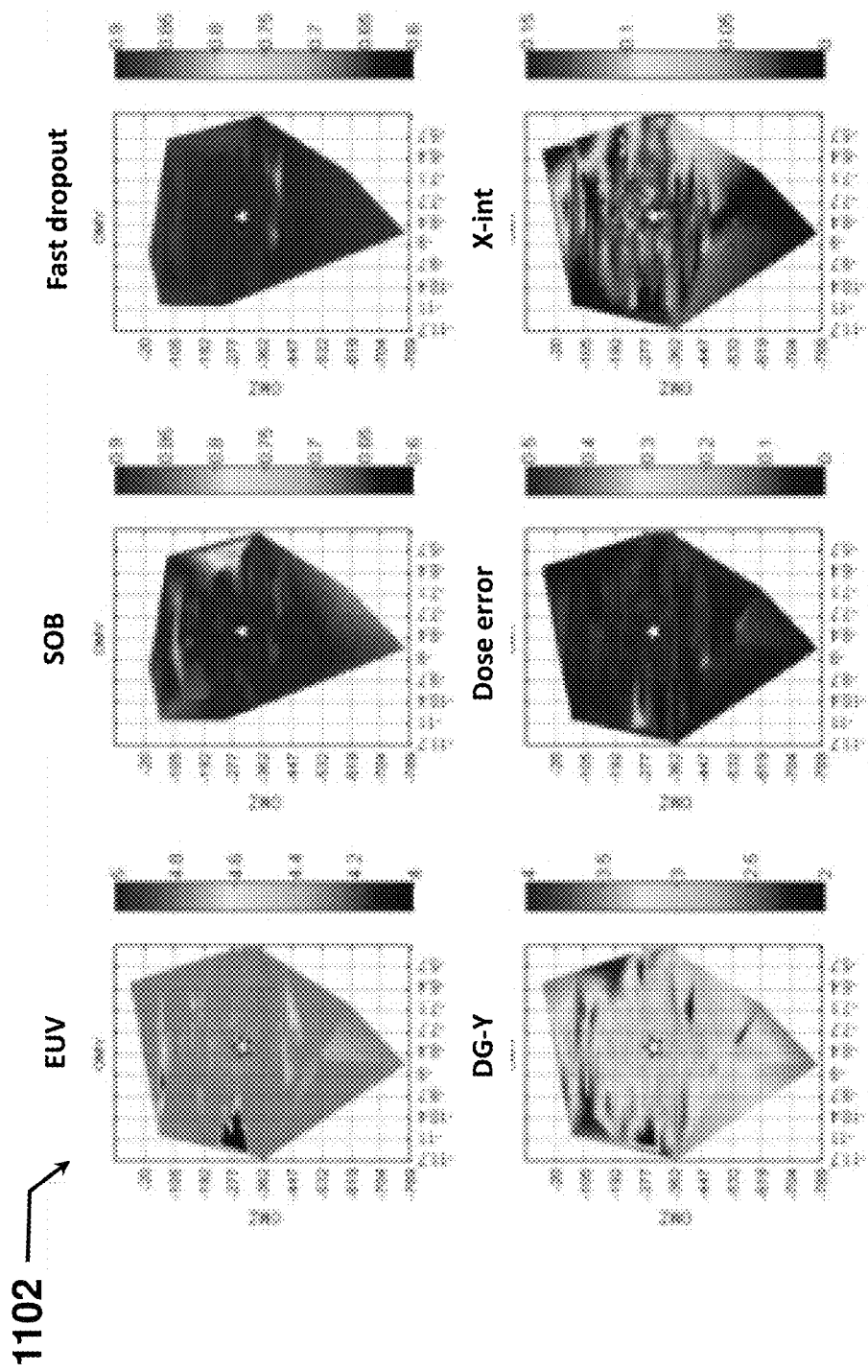

FIG. 5C illustrates examples of the key performance indicator map 1102 for performance related parameters, such as for example, EUV energy, DG-Y, Dose error, SOB, Fast dropout, and X-int. Each of the aforementioned examples corresponds to OMY and OMZ that are generated from the raw performance data 1006 by the optimization system 1000.

Referring to FIGS. 4 and 5D, in some embodiments, the sub-image data 1112 is provided to a classifier 1202. The classifier 1202 may review any combination of particular performance indicators for review. The reflectivity of the collector is one important key performance indicator for EUV. For example, in some embodiments as shown in FIG. 5D, the key performance indicator vector data 1104 can be classified as two categories, good and bad, by using historical data of the reflectivity (%) of the collector. In a particular embodiment, the classifier 1202 is defined as a degradation rate (%) 1206. It is observed that when the reflectivity (R %) is stable, the EUV source is at its maximum performance and maintains a stable condition 1208. In contrast, when the reflectivity (R %) shows a trend of fast decay, the EUV corresponds to a decaying performance 1209 and is in a unstable condition.

Figure 5E:
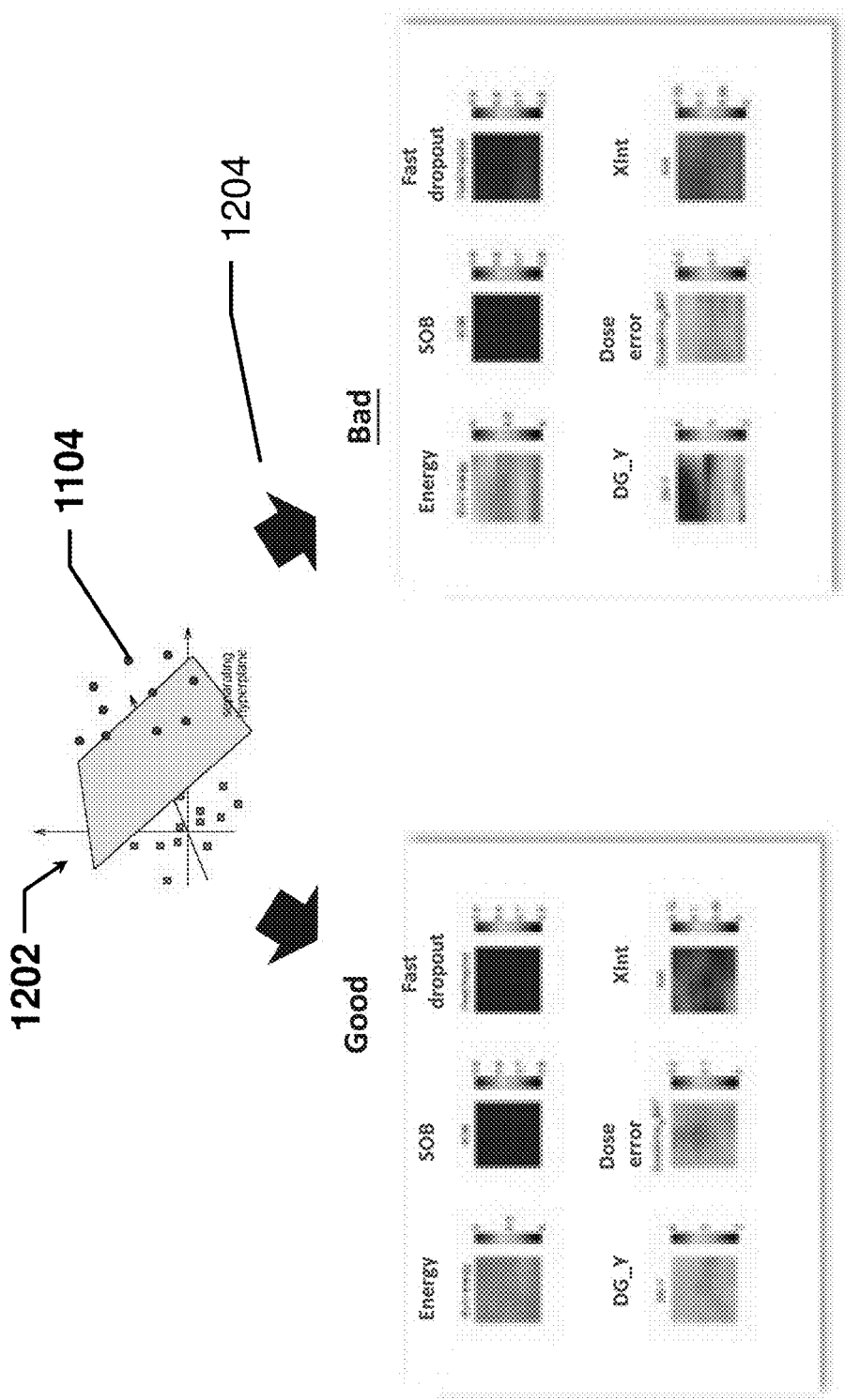

As shown in FIG. 4 and FIG. 5E, the key performance indicator vector data 1104 is classified in two categories, good and bad. The classifier 1202 generates a classifier decision 1204 based on the input regarding the reflectivity of the collector as shown in FIG. 5D. For example, if it is determined that the degradation rate of the reflectivity (%) is positive, then classifier decision indicating "good" is generated. If it is determined that the degradation rate (%) is negative, then a classifier decision indicating "bad" is generated. Such classifier decisions based on the analysis of the associated degradation rate (%) can be recorded in the form of Boolean output (e.g., true/false or 1/0) or another suitable format. The classifier decision 1204 may be combined with a time input (e.g., the time duration of which the degradation rate is positive or positive) to generate classified data 1212. The classified data 1212 can be separated based on the time duration that shows the degradation rate being positive and negative.

Figure 6:
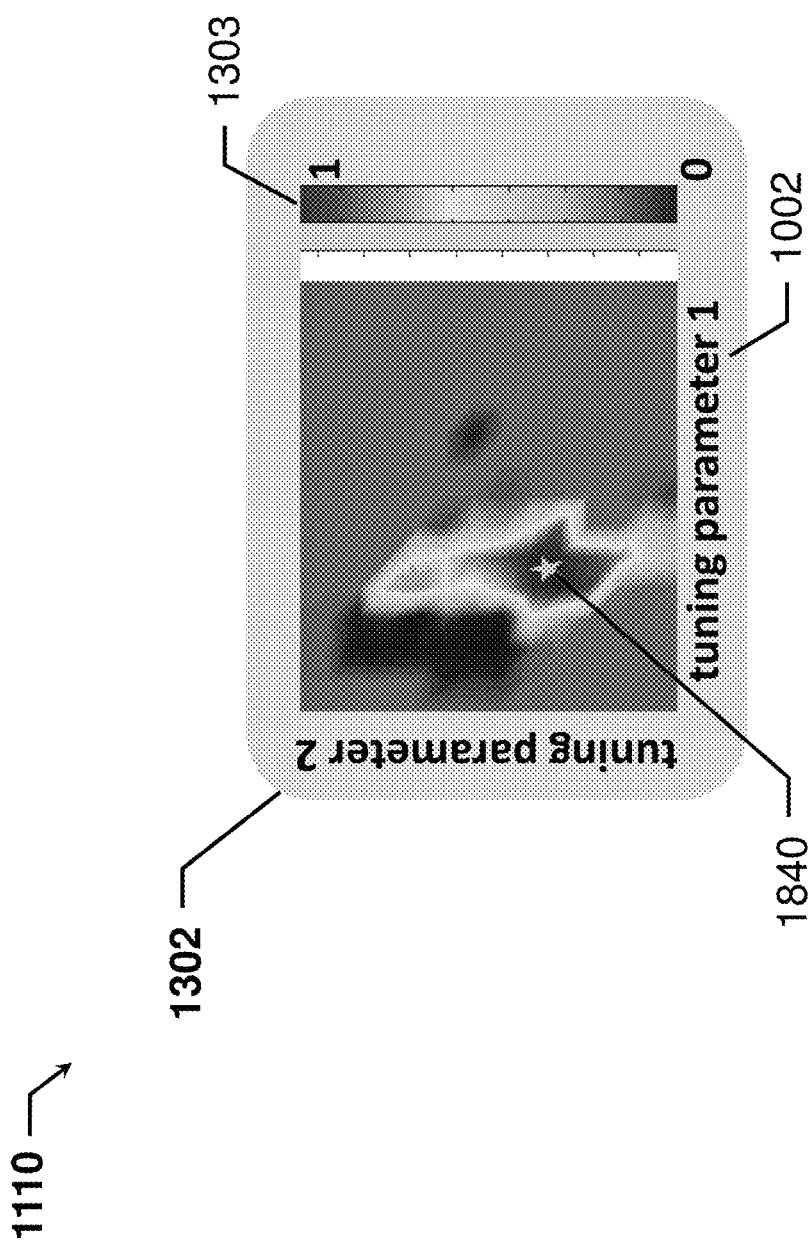
FIG. 6 illustrates a classified targeting probability map based on a form of the boolean output.

As shown in FIG. 6, the statistical learning component 1110 generates a targeting probability map 1302 based on the form of a boolean output 1303 (e.g., 1 or 0). The targeting probability map 1302 is configured to identify a second subset 1840 of the tuning parameters 1002 with a highest point accumulated by the boolean output as a newly suggested set point within the sub-image data for the chosen key performance indicator of interest. In some embodiments, the second subset 1840 of the tuning parameters 1002 may be chosen based on the density of the targeting probability map 1302.

Figure 7A:
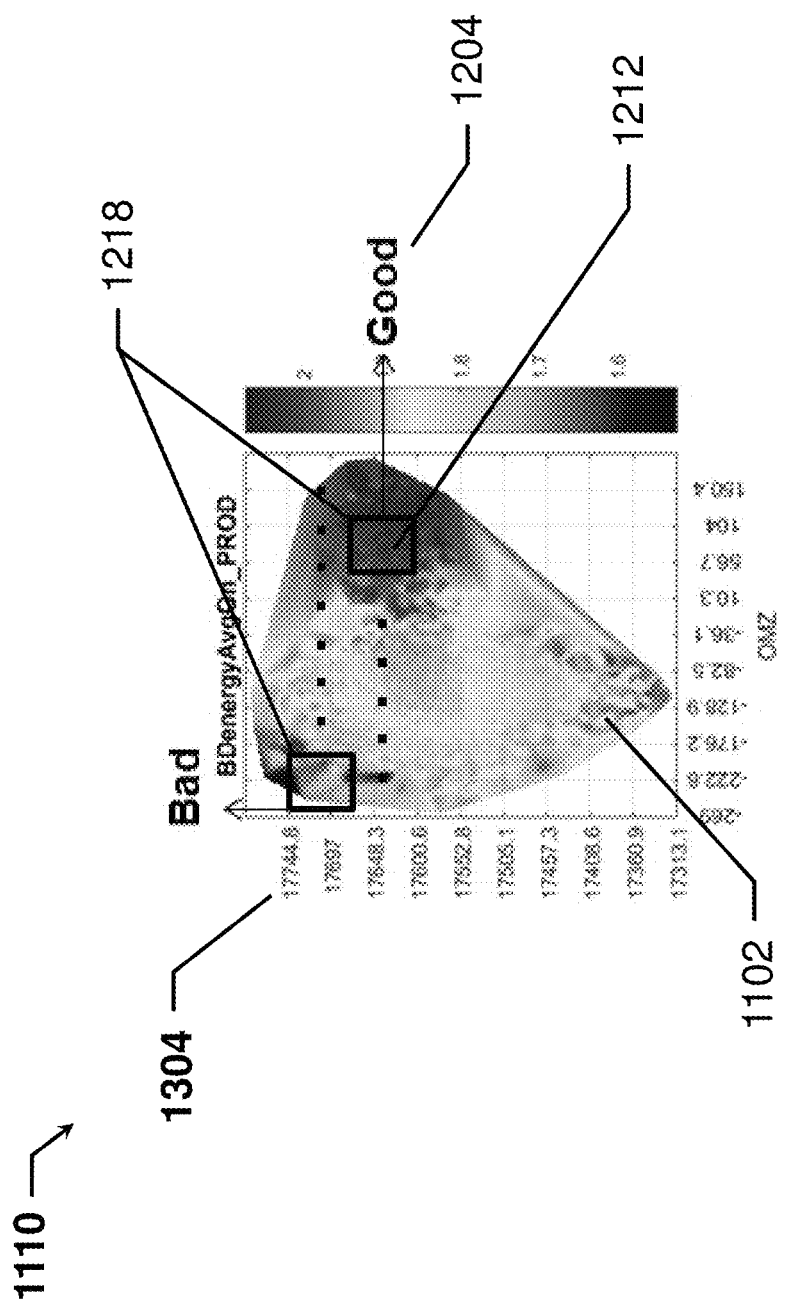
FIG. 7A illustrates a 2D suggestion map based on the key performance indicator map with the regions of interest based on the classifier decision.

FIG. 7A illustrates an exemplary 2D suggestion map 1304 based on the key performance indicator map 1102 combined with the classified data 1212 showing the regions of interest (ROI) 1218 based on the classifier decision 1204.

In some embodiments, as shown in FIG. 7B, statistical learning component 1110 may further utilize classification algorithms to generate 2D suggestion maps $1508_1$-$1508_N$. The 2D suggestion maps $1508_1$-$5108_N$ differ from one another based on the differences between corresponding classification algorithms $1504_1$-$1504_N$. Classification algorithms 1504 can represent one or more algorithms used by a corresponding 2D suggestion map $1508_1$-$1508_N$. In other words, the machine learning component 1502 generates a set of 2D suggestion maps $1508_1$-$1508_N$ that differ based on the respective classification algorithms $1504_1$-$1504_N$ that are trained by training data 1506 according to a machine-learning technique.

Figure 8A:
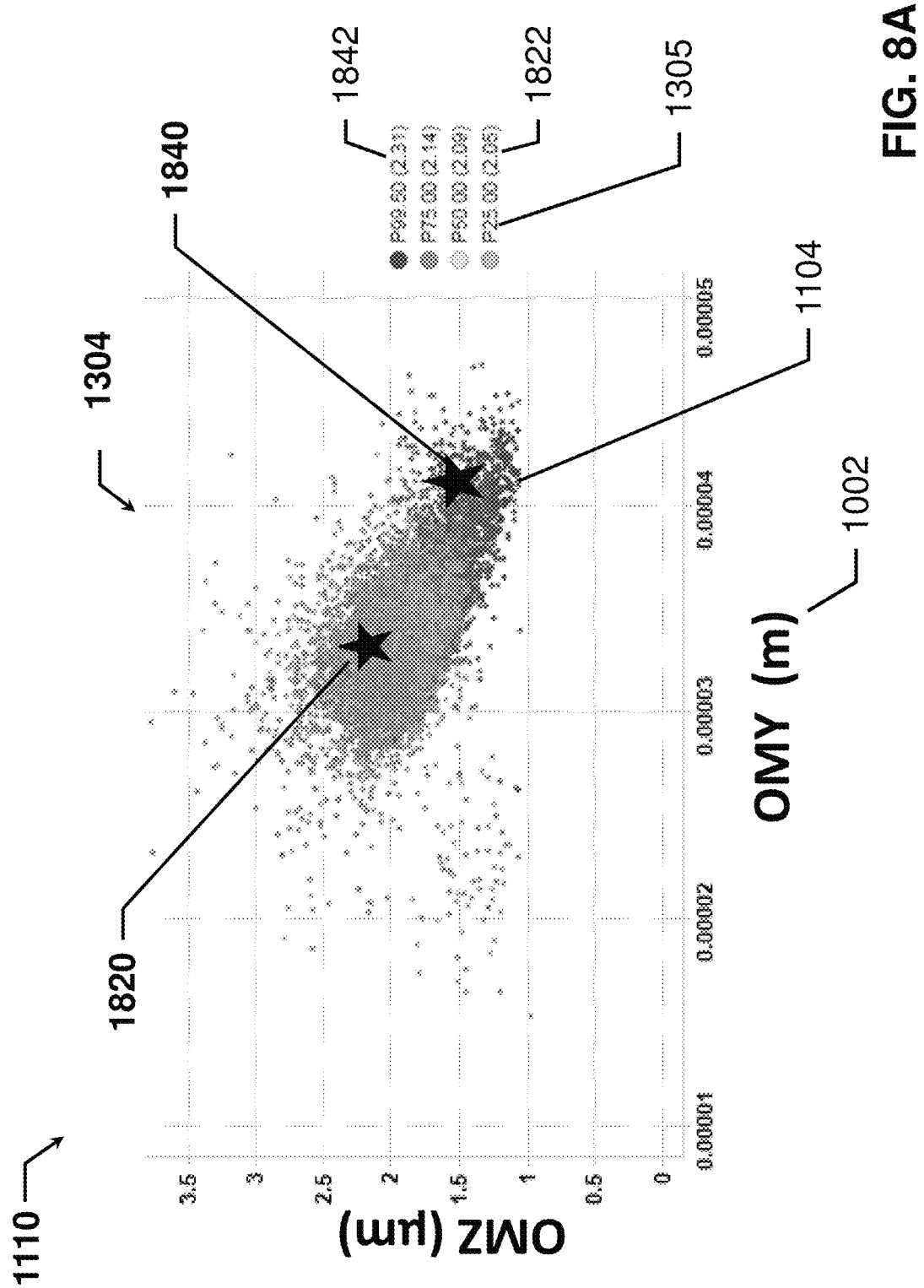
FIG. 8A illustrates a 2D suggestion map with original and newly suggested set points with scores for tuning parameters and performance indicator vector data.
Figure 8B:
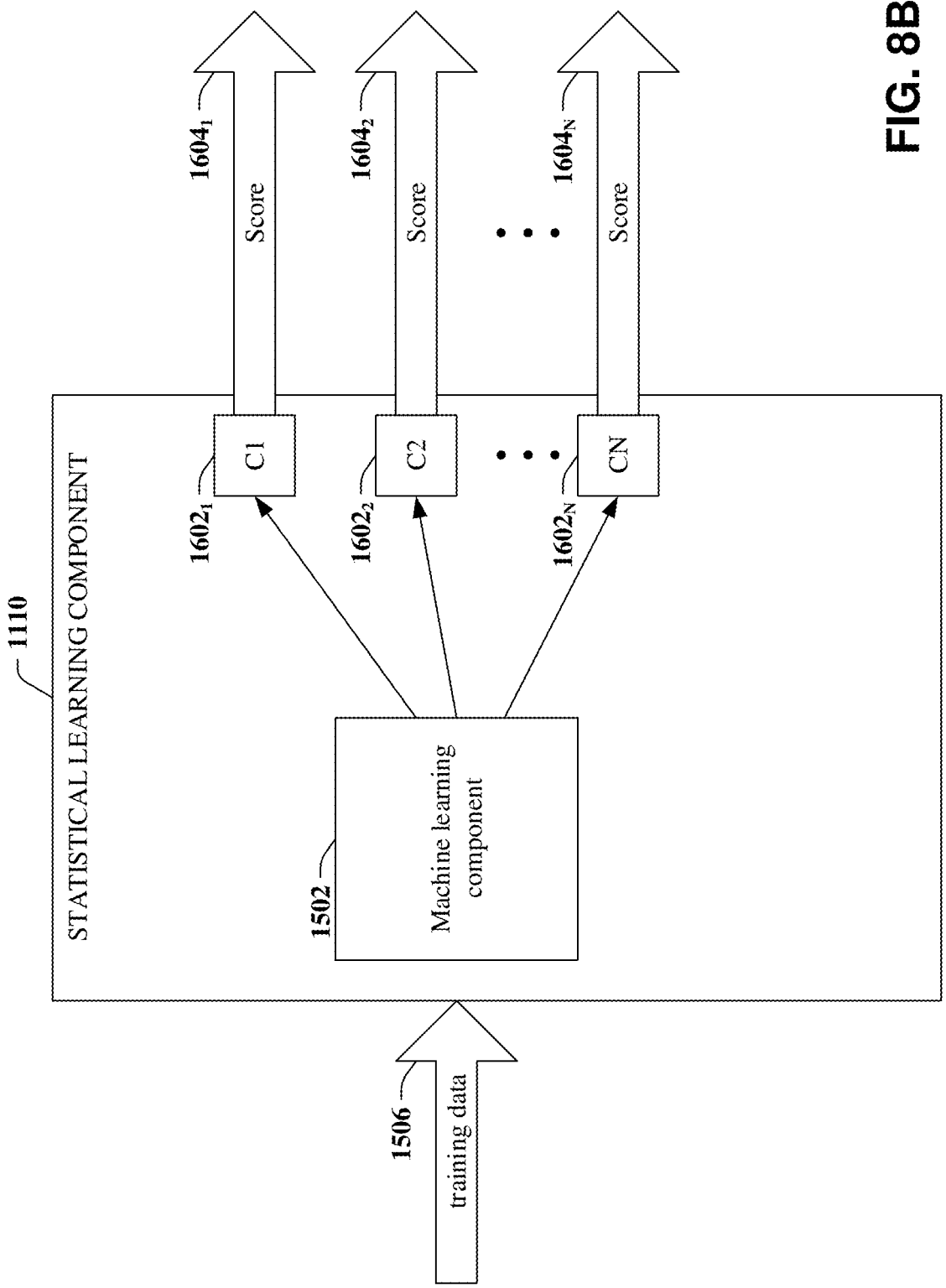
FIG. 8B shows a schematic of the apparatus for generating scores according to some embodiments of the present disclosure.

In some embodiments, as shown in FIGS. 8A and 8B, the statistical learning component 1110 generates the 2D suggestion map 1304 based on the form of particular scores 1305 (e.g., 25, 50, 75, 99.5). In particular embodiments, as shown in FIG. 8A, the statistical learning component 1110 identifies a first subset 1820 of the tuning parameters as an original set point 1822 based on the performance indicator vector data, EUV energy at 2.05 mJ. The 2D suggestion map 1304 is configured to identify a second subset 1842 of the tuning parameters 1002 with a highest point accumulated by the particular scores 1305 as a newly suggested set point for the chosen key performance indicator of interest. For example, as shown in FIG. 8A of this disclosure, the second subset 1840 of the key performance indicator vector data 1104 that have been chosen to indicate a newly suggested set point 1842, EUV energy of 2.31 mJ, by the statistical learning component 1110 disclosed herein.

In some embodiments, as shown in FIG. 8B, the statistical learning component 1110 utilizes a scoring function 1602 to generate scores $1604_1$-$1604_N$. For example, in some embodiments, the scores 1604 are determined based on the degradation rate regarding the reflectivity (R %) of the collector including positives, 0, and negatives. In some embodiments, the identification of negatives is assigned the value 25 of the scoring function, identification of 0 is assigned the value 50, and identification of positives is assigned higher values of 75 or 99.5 of the scoring function.

Figure 9B:
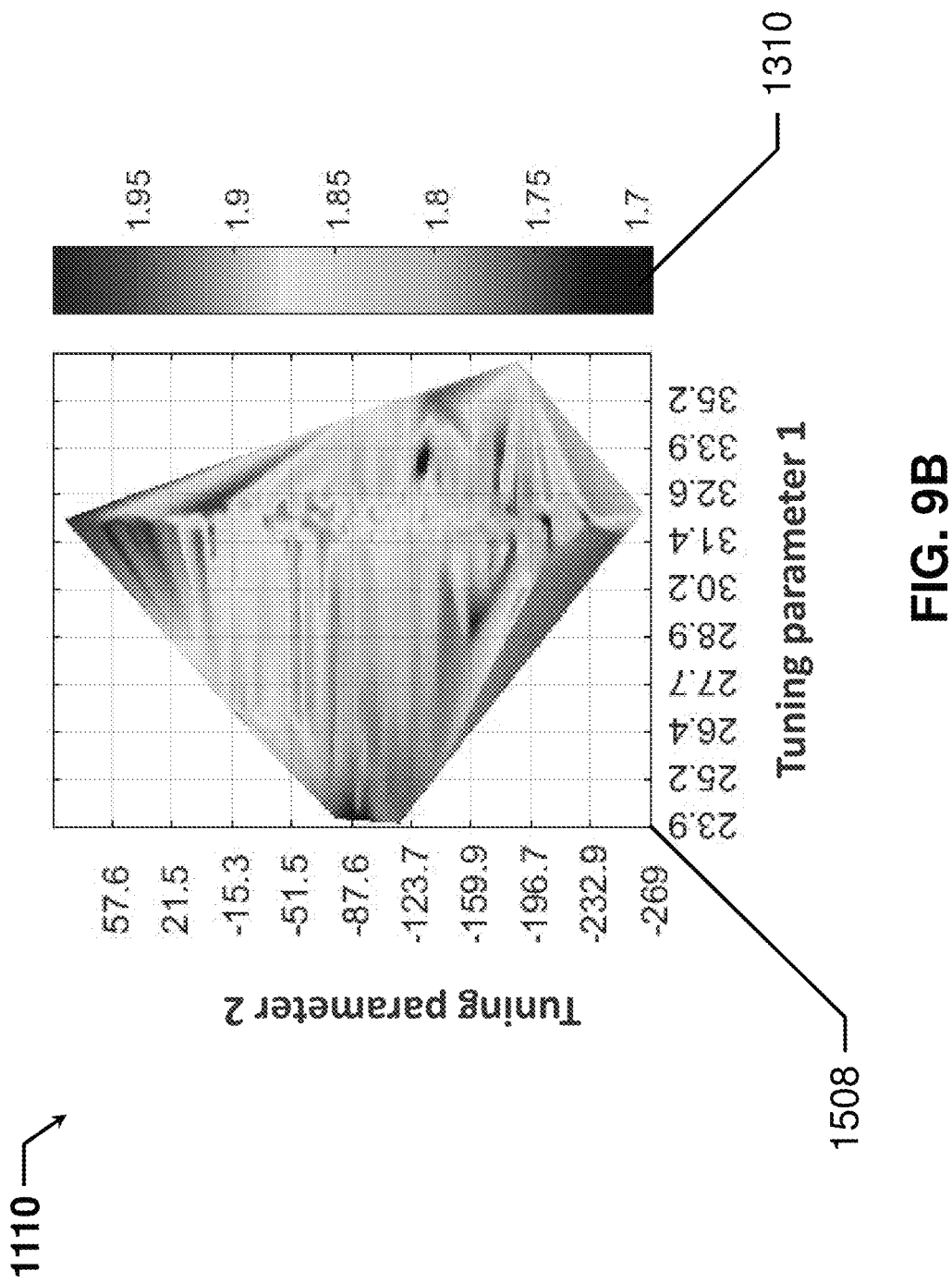
FIG. 9B illustrates a 2D suggestion map with scores based on policy data for tuning parameters and performance indicator vector data.

Referring to FIGS. 4, 9A and 9B, the statistical learning component 1110 can further include a policy 1308 that can generate policy data 1310. The policy data 1310 represents a weighting policy associated with the 2D suggestion maps 1508. In some embodiments, this weighting policy can be indicative of a weighting of importance. For example, the policy data 1310 is generated in response to input to a slider mechanism that is manipulated and/or modified to a value (or color, preference, etc.), as shown in FIG. 9B, between values on two opposing sides (or preferences), one corresponding to decreasing positives and one corresponding to increasing positives.

Similar to FIG. 7B, the 2D suggestion maps $1508_1$-$5108_N$ differ from one another based on the differences between corresponding classification algorithms $1504_1$-$1504_N$ including the policy data 1310 generated by the policy 1308. Classification algorithms 1504 can represent one or more algorithms used by a corresponding 2D suggestion map $1508_1$-$1508_N$. In other words, the machine learning component 1502 generates a set of 2D suggestion maps $1508_1$-$1508_N$ that differ based on respective classification algorithms $1504_1$-$1504_N$ including the policy data 1310 that are trained by training data 1506 according to a machine-learning technique.

Thus, targeting parameters may be re-optimized in-line without stopping the EUV system in order to maintain a stable EUV energy. FIGS. 5A-9B schematically illustrate the various parameters that are optimized in-line in various embodiments.

In various embodiments, the re-optimization is performed periodically, for example, every minute, every 5 minutes, every 10 minutes, every 30 minutes, etc. depending on, for example, how much variation in EUV radiation occurs. For example, if a variation in the EUV energy over a certain period of time is less than a threshold value (e.g., 1%, 5% or 10%), none of the parameters are optimized. However, if the variation in EUV energy over that period of time is more than the threshold value, one or more of the parameters is optimized. In various embodiments, the determination of which parameter is to be optimized is based on historical data relating to the variation in EUV energy as a function of variation in various parameters.

Figure 10A:
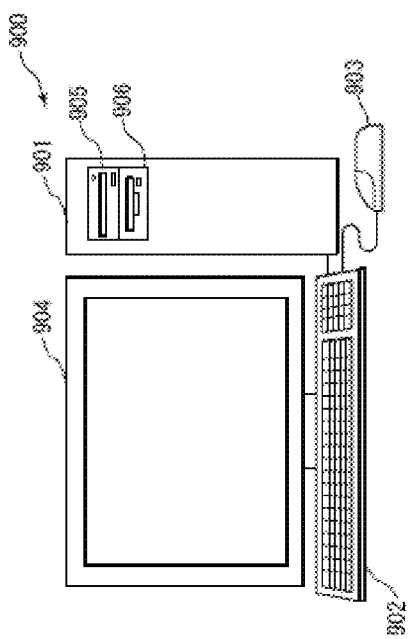
FIGS. 10A and 10B show a EUV data analyzing apparatus according to an embodiment of the present disclosure.
Figure 10B:
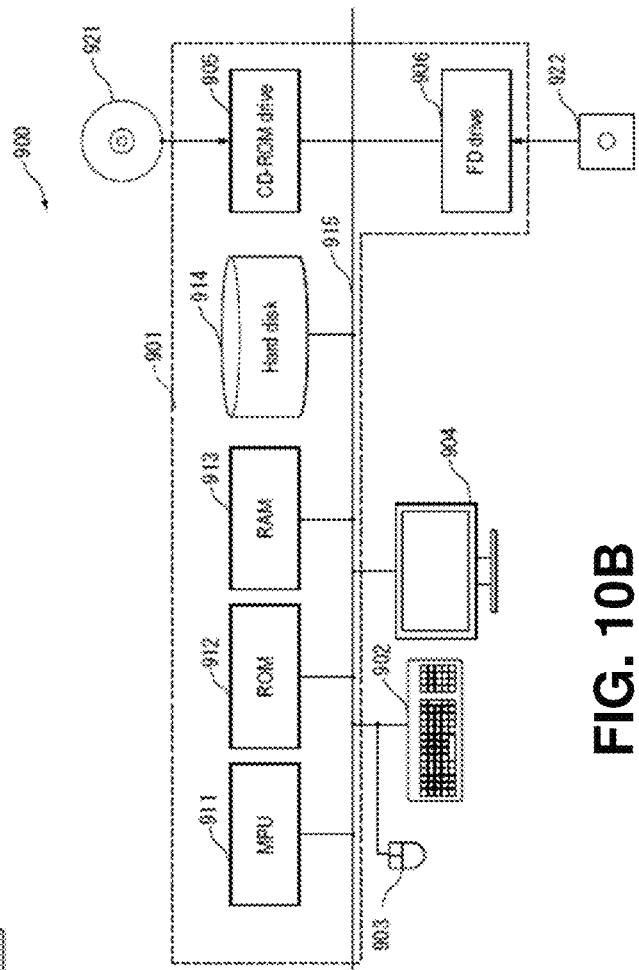

FIGS. 10A and 10B show a EUV data analyzing apparatus according to an embodiment of the present disclosure. FIG. 10A is a schematic view of a computer system that executes the in-line optimization process described above. The foregoing embodiments may be realized using computer hardware and computer programs executed thereon. In FIG. 10A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 10B is a diagram showing an internal configuration of the computer system 900. In FIG. 10B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the EUV data analyzing apparatus in the foregoing embodiments may be stored in an optical disk 921 or a magnetic disk 922, which are inserted into the optical disk drive 905 or the magnetic disk drive 906, and be transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the EUV data analyzing apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

Further, the entirety of or a part of the programs to realize the functions of the in-line optimization apparatus is a part of another program used for EUV parameter optimization processes in some embodiments. In addition, the entirety of or a part of the programs to realize the functions of the in-line optimization apparatus is realized by a ROM made of, for example, a semiconductor device in some embodiments.

The in-line optimization disclosed herein provides a more stable plasma generation and thereby more stable EUV radiation. The stable plasma generation prevents excessive contamination of the collector mirror and other parts of the chamber as illustrated in FIGS. 5A-9B. Moreover, the stable EUV radiation reduced dose error during lithography, thereby improving the patterns formed using the EUV radiation and the throughput of the lithography system. The stable EUV radiation emitted from the plasma according to the present disclosure is subsequently used to form patterns in a photoresist coated on a substrate. The patterns correspond to semiconductor device features to be formed in the substrate. In manufacturing steps, a photoresist is deposited on the substrate. The photoresist coated substrate is selectively exposed to the stable EUV radiation to form a latent pattern in the photoresist. The latent pattern is developed using a suitable developer to form a pattern in the photoresist. The pattern in the photoresist is then transferred to the substrate through an etching process. The in-line optimization disclosed herein, therefore, improves the accuracy of transferring the pattern onto the substrate.

An embodiment of the disclosure is an apparatus for generating extreme ultraviolet (EUV) radiation that includes a droplet generator, an excitation laser, an energy detector, and a feedback controller. The droplet generator is configured to generate target droplets. The excitation laser is configured to heat the target droplets using excitation pulses to convert the target droplets to plasma. The energy detector is configured to measure a variation in EUV energy generated when the target droplets are converted to plasma. The feedback controller is configured to adjust a parameter of at least one of the droplet generator or the excitation laser based on the variation in EUV energy. In some embodiments, the parameter of the droplet generator is at least one selected from the group consisting of droplet size, droplet temperature, time delay between successive droplets, and droplet velocity. In some embodiments, the parameter of the excitation laser is at least one selected from the group consisting of position of focus of a pre-pulse, position of focus of a main pulse, time delay between the pre-pulse and the main pulse, laser power, time delay between successive pre-pulses, time delay between successive main pulses, and laser pulse width. In some embodiments, the feedback controller is further configured to determine another parameter to be adjusted based on historical data relating to the variation in EUV energy as a function of a variation in the parameter. In some embodiments, the feedback controller is further configured to determine the parameter to be adjusted based on a targeting probability map including classified data sets of raw performance data by applying a classifying rule to the raw performance data. In some embodiments, the feedback controller is further configured to determine the parameter to be adjusted based on a 2D suggestion map based on a performance indicator map combined with classified data associated with the 2D suggestion map.

Another embodiment of the disclosure is a method of adjusting parameters of the droplet generator and the excitation laser based on the variation in EUV radiation. The method includes receiving raw performance data including performance indicators and tuning parameters. Subsequently, a performance indicator map is generated that includes performance indicator vector data corresponding to attributes of tuning parameters. Sub-image data is generated that includes a first subset of the raw performance data. The method also includes generating classified data sets of the raw performance data by applying a classifying rule to the sub-image data. Subsequently, a targeting probability map is generated that is based on the classified data sets. A second subset of the raw performance data is generated that is based on the targeting probability map. In response to a variation in performance data, a configurable parameter of the tuning parameters associated with the performance indicators is automatically adjusted to set the variation in performance data within a targeted range. In some embodiments, raw performance data includes performance indicators selected from the group consisting of EUV energy, DG-Y, Dose error, SOB, Fast dropout, and X-int. In some embodiments, raw performance data also includes tuning parameters selected from the group consisting of OMY, OMZ, T-fire, and PPAOM2. In some embodiments, a sub-image includes a region of interest. In some embodiments, classified data sets are received that include a classifying rule based on a degradation rate of a reflectivity of a collector. In some embodiments, a targeting probability map is based on a boolean output. In some embodiments, the determining a second subset of the raw performance data is based on a density of the targeting probability map. In some embodiments, the method further includes generating a 2D suggestion map based on the performance indicator map combined with the classified data. In some embodiments, the method further includes generating a 2D suggestion map based on the performance indicator map combined with the classified data and a policy associated with the 2D suggestion map.

Another embodiment of the disclosure is system that includes a memory, a processor, a performance indicator map, and a statistical learning component. The memory stores computer executable components. The processor executes computer executable components stored in the memory. The performance indicator map generates performance indicator vector data corresponding to attributes of tuning parameters. The statistical learning component receives sub-image data corresponding to a first subset of the tuning parameters. The statistical learning component also generates classified data sets by applying a classifying rule to the sub-image data. The statistical learning component determines a second subset of the tuning parameters based on the targeting probability map. In response to a variation in performance data, the statistical learning component automatically adjusts the tuning parameters associate with the performance indicators to set the variation in performance data within a targeted range. In some embodiments, the system further includes generating a 2D suggestion map based on the performance indicator map combined with the classified data. In some embodiments, the system further includes generating a 2D suggestion map based on the performance indicator map combined with the classified data and a policy associated with the 2D suggestion map. In some embodiments, the classified data sets includes a classifying rule based on a degradation rate of a reflectivity of a collector. In some embodiments, the system further include classification algorithms and training data.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for generating extreme ultraviolet (EUV) radiation, the apparatus comprising:
   a droplet generator configured to generate target droplets;
   an excitation laser configured to heat the target droplets using excitation pulses to convert the target droplets to plasma;
   an energy detector configured to determine a variation in EUV energy generated when the target droplets are converted to plasma; and
   a feedback controller configured to adjust a value of a first parameter of one or more parameters of the droplet generator or the excitation laser based on the variation in the EUV energy,
   wherein the feedback controller is configured to adjust the value of the first parameter based on a 2D suggestion map of the EUV energy, wherein the 2D suggestion map of the EUV energy is created based on a performance indicator map of the EUV energy combined with classified data associated with the performance indicator map of the EUV energy.

2. The apparatus of claim 1, wherein the parameters of the droplet generator comprise a droplet size, a droplet temperature, a time delay between successive droplets, and a droplet velocity.

3. The apparatus of claim 1, wherein the parameters of the excitation laser comprise a position of focus of a pre-pulse, a position of focus of a main pulse, a time delay between the pre-pulse and the main pulse, a laser power, a time delay between successive pre-pulses, a time delay between successive main pulses, and a laser pulse width.

4. The apparatus of claim 1, wherein the feedback controller is further configured to adjust a value of a second parameter of the one or more parameters based on historical data relating to the variation in EUV energy as a function of the second parameter.

5. The apparatus of claim 1, wherein the 2D suggestion map indicates two or more regions of interest based on the classified data associated with the performance indicator map that is generated by applying a classifying rule to the performance indicator map.

6. The apparatus of claim 1, wherein the performance indicator map of the EUV energy is based on two parameters including the first parameter.

7. The apparatus of claim 6, wherein the excitation laser comprises a pre-heat laser configured to send a pre-pulse and a main laser configured to send a main pulse to heat the target droplets to convert the target droplets to plasma, and wherein the first parameter is selected from the group consisting of a distance in a y-axis between a target droplet and a focal point of the pre-pulse (OMY), a distance in a z-axis between the target droplet and the focal point of the pre-pulse (OMZ), a distance in a x-axis between the target droplet and the focal point of the pre-pulse (OMX), a time between when the target droplet is detected by a droplet detection module and when the pre-pulse is fired (T-fire).

8. An apparatus for generating extreme ultraviolet (EUV) radiation, the apparatus comprising:
a droplet generator configured to generate target droplets;
an excitation laser configured to heat the target droplets using excitation pulses to convert the target droplets to plasma;
a detector configured to determine a variation in a key performance indicator generated when the target droplets are converted to plasma; and
a feedback controller configured to adjust a value of a first parameter of one or more parameters of the droplet generator or the excitation laser based on the variation in the key performance indicator,
wherein the feedback controller is configured to adjust the value of the first parameter based on a 2D suggestion map of the key performance indicator, wherein the 2D suggestion map of the key performance indicator is created based on a performance indicator map of the key performance indicator combined with classified data associated with the performance indicator map of the key performance indicator.

9. The apparatus of claim 8, further comprising:
a collector mirror, wherein the excitation laser comprises a pre-heat laser configured to send a pre-pulse and a main laser configured to send a main pulse to heat the target droplets to convert the target droplets to plasma, and wherein the key performance indicator is selected from the group consisting of a detected EUV energy, an offset distance in a y-axis of a target droplet position (DG-Y), a percent difference between applied and expected doses (dose error), a start of burst (SOB) effect that is an unstable EUV energy generated at a beginning of a target droplet bursting, a fast dropout energy that is an unstable EUV energy causing a target droplet to undergo insufficient expansion before being hit by the main pulse, and a reflectivity rate of the collector mirror.

10. The apparatus of claim 8, wherein the performance indicator map of the of the key performance indicator is based on two parameters including the first parameter.

11. The apparatus of claim 8, wherein the parameters of the droplet generator comprise a droplet size, a droplet temperature, a time delay between successive droplets, and a droplet velocity, and wherein the parameters of the excitation laser comprise a position of focus of a pre-pulse, a position of focus of a main pulse, a time delay between the pre-pulse and the main pulse, a laser power, a time delay between successive pre-pulses, a time delay between successive main pulses, and a laser pulse width.

12. The apparatus of claim 8, wherein the feedback controller is further configured to adjust a value of a second parameter of the one or more parameters based on historical data relating to the variation in EUV energy as a function of the second parameter.

13. The apparatus of claim 8, wherein the excitation laser comprises a pre-heat laser configured to send a pre-pulse and a main laser configured to send a main pulse to heat the target droplets to convert the target droplets to plasma, and wherein the first parameter is selected from the group consisting of a distance in a y-axis between a target droplet and a focal point of the pre-pulse (OMY), a distance in a z-axis between the target droplet and the focal point of the pre-pulse (OMZ), a distance in a x-axis between the target droplet and the focal point of the pre-pulse (OMX), a time between when the target droplet is detected by a droplet detection module and when the pre-pulse is fired (T-fire).

14. The apparatus of claim 8, wherein the 2D suggestion map is generated based on the performance indicator map of the key performance indicator combined with the classified data associated with the performance indicator map of the key performance indicator and a weighting policy associated with the 2D suggestion map.

15. An apparatus for generating extreme ultraviolet (EUV) radiation, the apparatus comprising:
a droplet generator configured to generate target droplets;
an excitation laser comprising a pre-heat laser and a main laser configured to heat the target droplets using excitation pulses to convert the target droplets to plasma, wherein the excitation pulses respectively comprise pre-pulses of the pre-heat laser and main pulses of the main laser;
an energy detector configured to determine a variation in EUV energy generated when the target droplets are converted to plasma; and
a feedback controller configured to adjust a value of a first parameter of one or more parameters of the droplet generator and the excitation laser based on the variation in the EUV energy,
wherein the feedback controller is configured to adjust the value of the first parameter based on a 2D suggestion map of the EUV energy, wherein the 2D suggestion map of the EUV energy is created based on a performance indicator map of the EUV energy, based on the first parameter, combined with classified data associated with the performance indicator map of the EUV energy.

16. The apparatus of claim 15, wherein the parameters of the droplet generator comprise a droplet size, a droplet temperature, a time delay between successive droplets, and a droplet velocity.

17. The apparatus of claim 15, wherein the parameters of the excitation laser comprise a position of focus of a pre-pulse, a position of focus of a main pulse, a time delay between the pre-pulse and the main pulse, a laser power, a time delay between successive pre-pulses, a time delay between successive main pulses, and a laser pulse width.

18. The apparatus of claim 15, wherein the feedback controller is further configured to adjust a value of a second parameter of the one or more parameters based on historical data relating to the variation in EUV energy as a function of the second parameter.

19. The apparatus of claim 15, wherein the performance indicator map of the EUV energy is based on two parameters including the first parameter.

20. The apparatus of claim 19, wherein the first parameter is selected from the group consisting of a distance in a y-axis between a target droplet and a focal point of a pre-pulse (OMY), a distance in a z-axis between the target droplet and the focal point of the pre-pulse (OMZ), a distance in a x-axis between the target droplet and the focal point of the pre-pulse (OMX), a time between when the target droplet is detected by a droplet detection module and when the pre-pulse is fired (T-fire).

* * * * *